United States Patent [19]
Ishida

[11] Patent Number: 5,896,274
[45] Date of Patent: Apr. 20, 1999

[54] PC CARD AND FRAME KIT THEREFOR

[75] Inventor: Mitsuo Ishida, Tokyo, Japan

[73] Assignee: Hirose Electric Co., Ltd., Tokyo, Japan

[21] Appl. No.: 08/803,086

[22] Filed: Feb. 20, 1997

[30] Foreign Application Priority Data

Mar. 5, 1996 [JP] Japan ................................. 7-073070

[51] Int. Cl.⁶ ............................................. H05K 1/14
[52] U.S. Cl. ............................................. 361/737; 439/946
[58] Field of Search ............................ 439/108, 607, 439/64, 946; 361/737, 800, 818

[56] References Cited

U.S. PATENT DOCUMENTS 5,605,463  2/1997  MacGregor et al. ............... 439/64

FOREIGN PATENT DOCUMENTS 2699039   6/1994   France .
4023319  12/1991   Germany .
2292483   2/1996   United Kingdom .

*Primary Examiner*—Neil Abrams
*Attorney, Agent, or Firm*—Kanesaka & Takeuchi

[57] ABSTRACT

A metal panel (11) for covering a PC card has an accommodating opening (18) for exposing the ground connection section (21) of a socket connector (2). A projected edge (7B) is provided on the frame holder (4) and a liner projection (32) is formed on the socket connector (2). The projected edge (7B) is located to fill in and close gaps between the ground connection section (21) and edges of the accommodation opening (18). In other embodiments, a C-shaped projection (32) on the socket (30) is used as the sole means to close or fill in the gap.

6 Claims, 15 Drawing Sheets

PC CARD AND FRAME KIT THEREFOR

BACKGROUND OF THE INVENTION

1. Field of the Invention

The present invention relates to PC cards and frame kits for the PC cards.

2. Description of the Prior Art

PC cards have at the front end a socket connector for connection to a mating connector of equipment. FIG. 19 shows a conventional PC card 51 has a socket connector having a metal ground plate 53 with dimples 52 provided on the front surface. The dimples 52 are made semi-spherical so as to assure contact with a shield plate of the mating connector. A metal panel 54 is provided in attempts to shield the entire surface of the PC card 51. A cut-out 54A is provided at the front end of the metal panel 54 to expose the dimples 52 on the ground plate 53.

The PC card 51 has a frame holder 61 for holding at the front end a socket connector 55 for connection to a mating connector 71. As shown in FIG. 20, the socket connector 55 has a housing 57 with upper and low rows of apertures for receiving contact elements 56 for contact with contact elements 72 of the mating connector 71. The contact elements 56 have upper and lower contact tongues for assuring contact with the mating contact elements 72. Also, they have rear contact portions 56A for contact with signal conductors of a card substrate 58. Ground conductors are provided between the signal conductors formed on the card substrate 58 corresponding to the respective contact portions 56A.

The ground plate 53 put on top of the housing 57 has a ground terminal 53A bending downwardly in the vicinity of the dimple 52 so as to make a resilient contact with a ground contact of the card substrate 58. The ground terminal 53A extend rearwardly through a cut-out 54A of the upper panel 54.

A shield plate 73 is provided on the mating connector 71 and having a front contact piece 75 which is folded back into a PC card receiving cavity 74.

When the PC card 51 is pushed into the receiving cavity 74 such that the socket connector 55 is connected to the mating connector 71, the contact elements 56 are fitted over the contact elements 72, and the dimples 52 of the ground plate 53 contact the contact piece 75 of the shield plate 73 so that the ground circuit of the PC card is grounded via the shield plate 73 and the ground plate 53.

Since the thickness of PC cards is regulated by the standards, it is necessary to form the cut-out 54A in the metal panel 54 corresponding to the ground plate 53 of the socket connector 55. Although the ground plate 53 shields the connection between the socket connector 55 and the mating connector 71, there is a gap between the ground plate 53 and the metal panel 54 at the cut-out 54A, allowing dust and/or water to enter and providing a poor appearance. If the metal panel 54 and the ground plate 53 are put closely, they could contact each other, permitting noise to be transmitted from the metal panel and/or connector or cable to the ground plate to interfere signals.

SUMMARY OF THE INVENTION

Accordingly, it is an object of the invention to provide a PC card and a frame kit for the PC card having a gap between the metal panel and the ground plate closed to prevent entrance of dust and/or water and assure insulation between the metal panel and the ground plate.

According to the invention, a PC card includes a card substrate, a socket connector attached to the card substrate, a frame holder made from an insulating material so as to hold edges of the card substrate and the socket connector, and a pair of metal panels.

The socket connector has at least one contact element and a ground plate for connection to signal and ground conductors formed on the card substrate and attached to the front end of the card substrate.

The contact element has a connection section for connection to a mating connector and a contact section for contact with a signal conductor of the card substrate. The ground plate has a connection section for connection to a shield plate of the mating connector and a ground terminal for contact with the ground conductor of the card substrate. It is preferred that the ground connection section on the socket connector has dimples for assure contact with the shield plate of the mating connector. The ground plate has a curved section extending from the ground connection section into the PC card and at its free end a ground terminal for contact with the card substrate.

The metal panels are made so as to cover almost the entire surfaces of the PC card except for a accommodation opening provided along the curved section of the ground contact section.

According to the invention, at least one of the frame holder and the socket connector has a linear projection in alignment with an edge of the accommodation opening of the metal panel so as to close a gap between the ground plate and the metal panel.

With such a structure as described above, it is possible to prevent entrance of dust and/or water. The linear projection prevent contact between the ground plate and the metal panel placed closely, thus minimizing the gap between them.

Where the accommodation opening is made in the form of a window, the linear projection is provided on (1) the frame holder and the socket connector to form a closed linear projection in alignment with an edge of the window and surrounding the ground connection or (2) the socket connector in a closed form surrounding the ground connection. There is provided an insertion slot through which the curved section of the ground plate extend such that the ground terminal reaches the card substrate. Alternatively, the accommodation opening is made in the form of a cut-out opening on the front side. In the above case (1), a linear projection is provided on the frame holder along an edge of the cut-out. In the case (2), a similar linear projection is provided on the socket connector.

DESCRIPTION OF THE PREFERRED EMBODIMENT

An embodiment of the invention will be described below with reference to the accompanying drawing.

Figure 1:
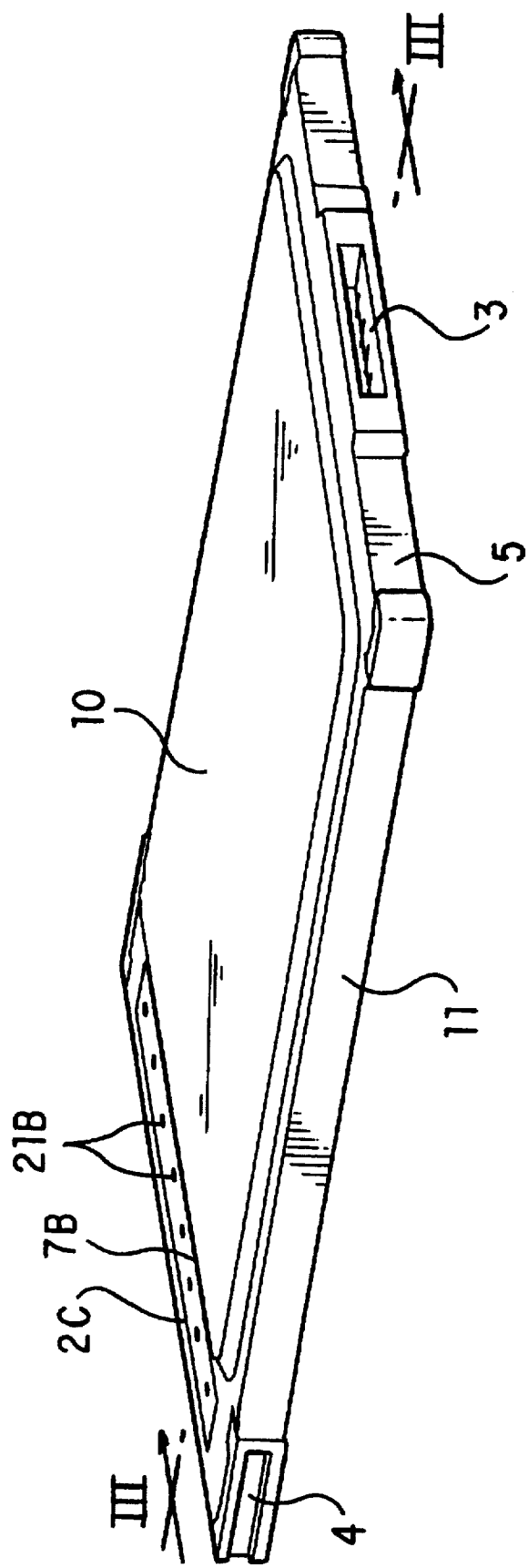
FIG. 1 is a perspective view of a PC card according to an embodiment of the invention.
Figure 2:
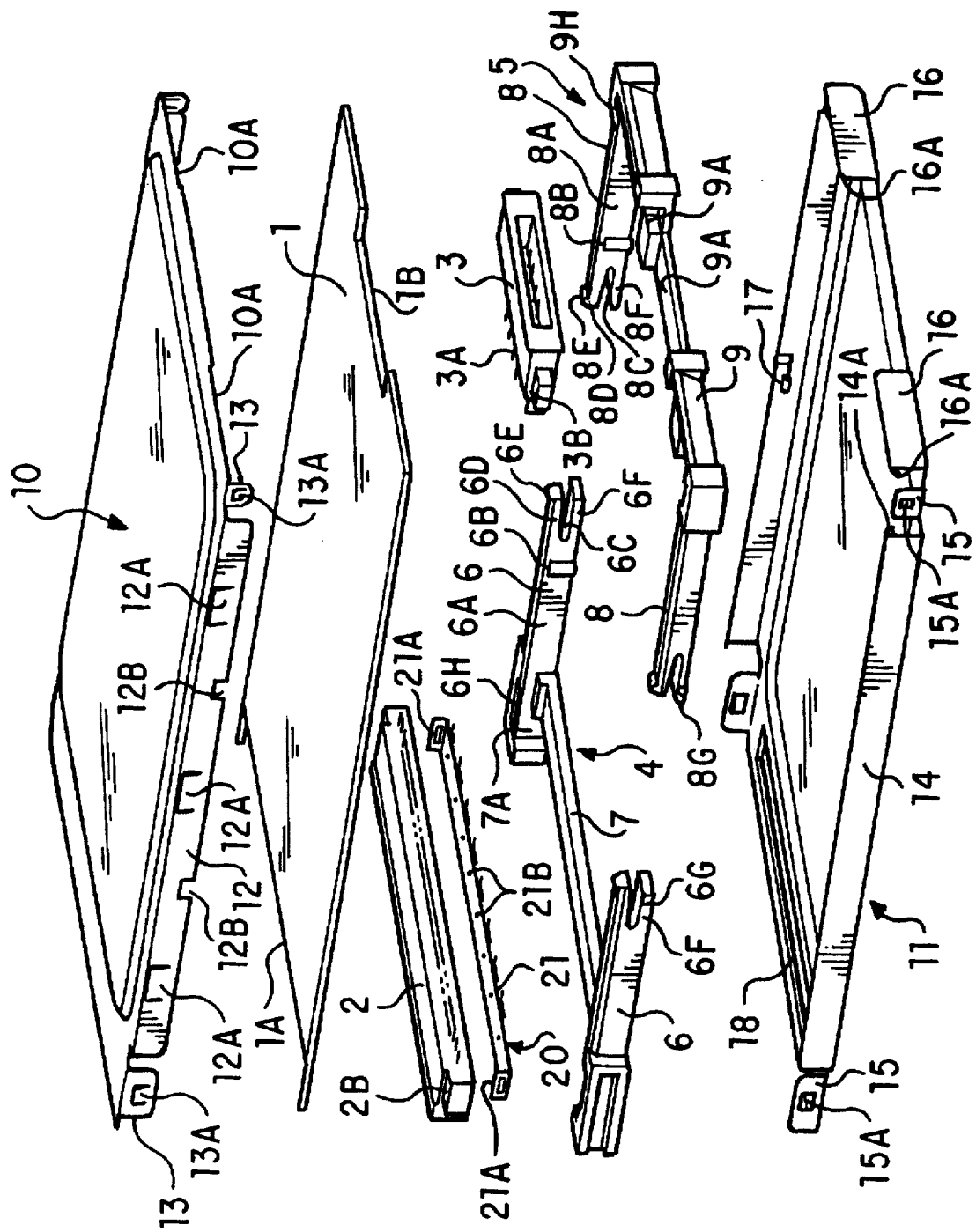
FIG. 2 is an exploded perspective view of the PC card of FIG. 1 set upside down.
Figure 3:
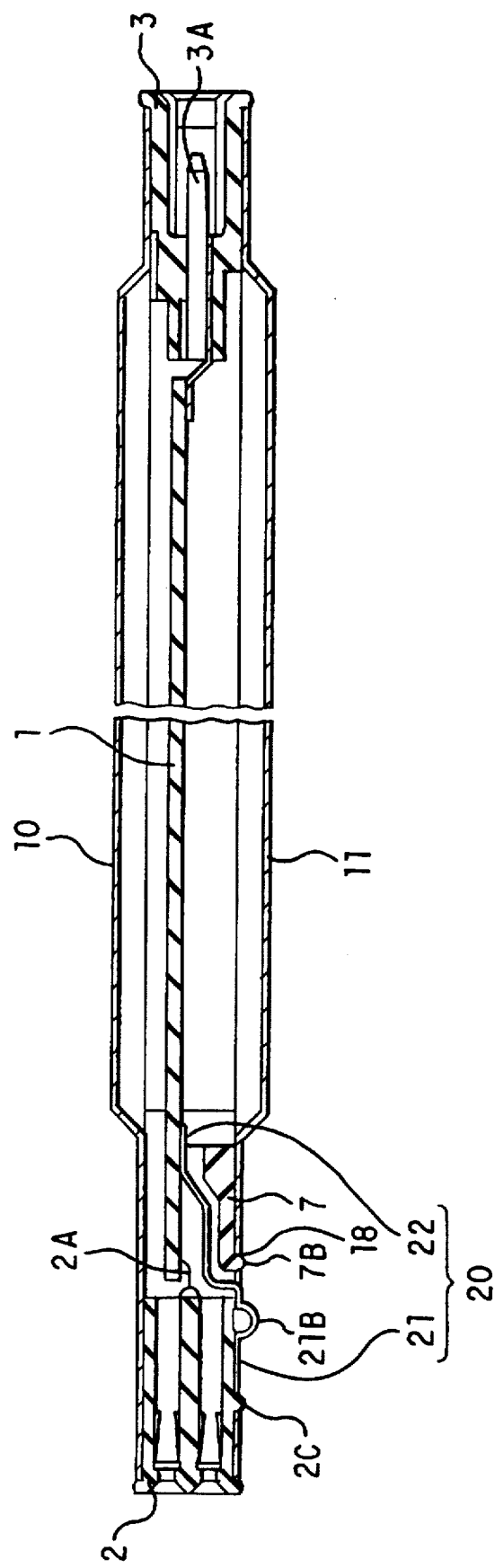
FIG. 3 is a sectional view taken along line III—III of FIG. 1.
Figure 4:
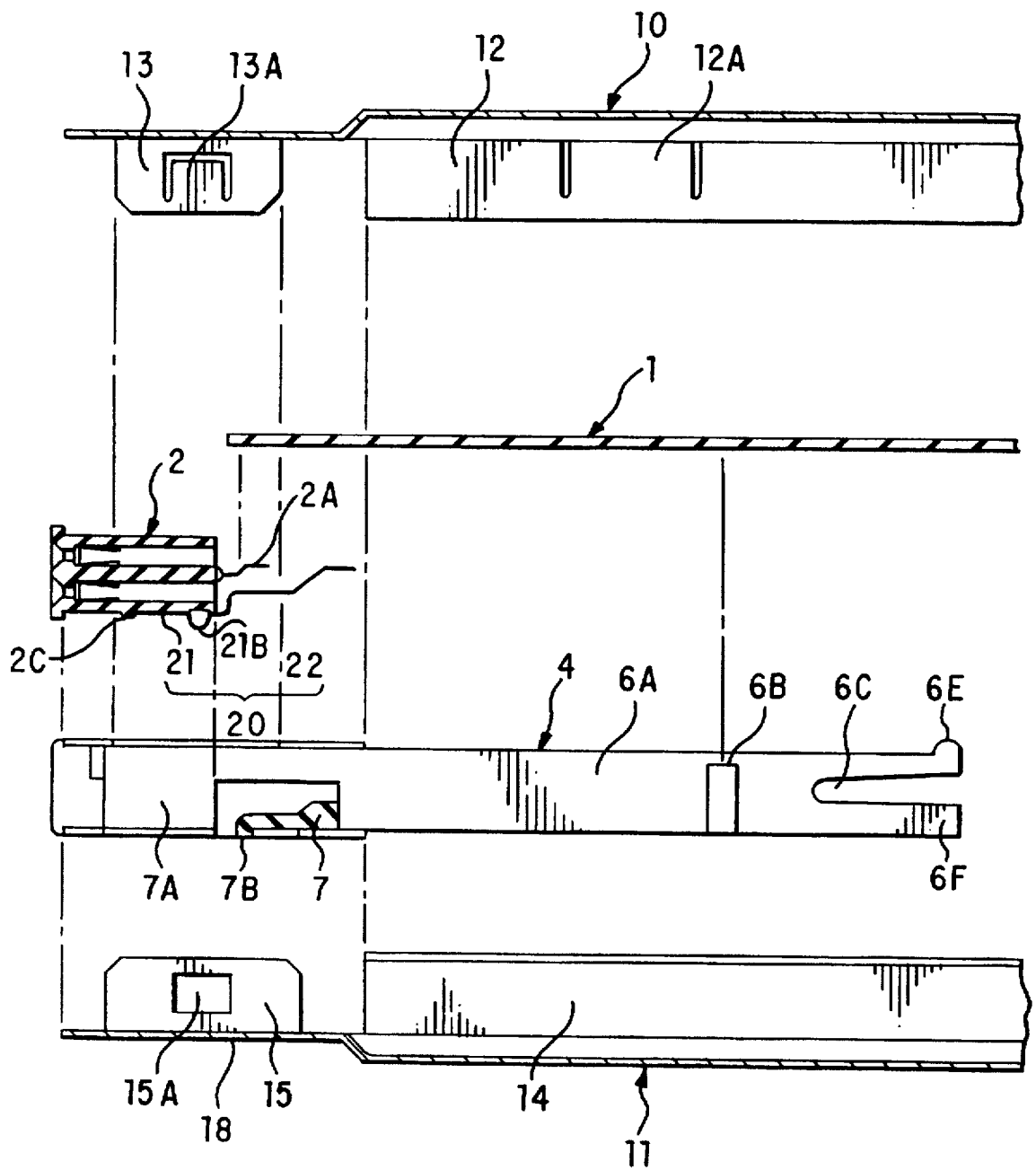
FIG. 4 is an exploded sectional view of the portion shown in FIG. 3.

FIG. 1 is a perspective view of a PC card according to a first embodiment of the invention; FIG. 2 is an exploded perspective view of the PC card before assembling; FIG. 3 is a sectional view taken along line III—III of FIG. 1; and FIG. 4 is an exploded sectional view of the essential part of the PC card before assembling. The PC card of FIG. 1 has a card substrate 1 (memory card) as shown in FIG. 2 and cutouts 1A and 1B for receiving a socket connector 2 at its front end and a rear connector 3 at its rear end, respectively.

As shown in FIG. 2, a plurality of contact elements 2A and 3A extend through the connectors 2 and 3 and are to be connected at one end to corresponding conductors of the card substrate 1 and at the other end free for connection to other equipment. Attaching extensions 2B and 3B extend outwardly from opposite ends of the connectors 2 and 3 for attaching the connectors 2 and 3 to the card substrate 1 in the cutouts 1A and 1B with screws or the like. A ground plate 20 is attached to the bottom of the socket connector 2 (see FIG. 4). As shown in FIG. 2, the ground plate 20 has a ground connection section 21 for covering the bottom of the socket connector 2 and a plurality of ground terminals 22 extending from the ground connection section 21 (see FIGS. 3 and 4, too). Leg members 21A extend upwardly from opposite ends of the ground connection section 21 and are inserted into slits 2D (FIG. 5) of the socket connector 2 for securing the ground plate 20 to the socket connector 2. Dimples 21B project downwardly from the ground connection section 21 near the ground terminals. The ground terminals 22 extend rearwardly from the ground connection section 21 as shown in FIG. 4. The socket connector 2 is attached to the card substrate 1 for forming a substrate assembly.

A frame holder for supporting the substrate assembly is made of an insulation material so as to provide front and rear frames 4 and 5. The front and rear frames 4 and 5 are formed substantially in "H" and "C" shapes, respectively.

The front frame 4 has two side sections 6 and a link section 7 for linking the side sections to form the H shape. The frame side sections 6 have a guide face 6A for guiding the card substrate 1 and a support projection 6B for supporting the card substrate 1. Grooves 6C are provided on rear ends of the side sections 6 for forming flexible arms 6D with resilient projections 6E. Lower arms 6F of the U-shaped ends have outside projections 6G. Slits 6H are provided in the front ends of the front frame 4.

As shown in FIG. 2, the link section 7 are connected to the lower portions of side sections 6 for forming guide channel 7A so that the attaching extensions 2B of the socket connector 2 are fitted in the guide channels 7A for attaching the socket connector 2.

Figure 6:
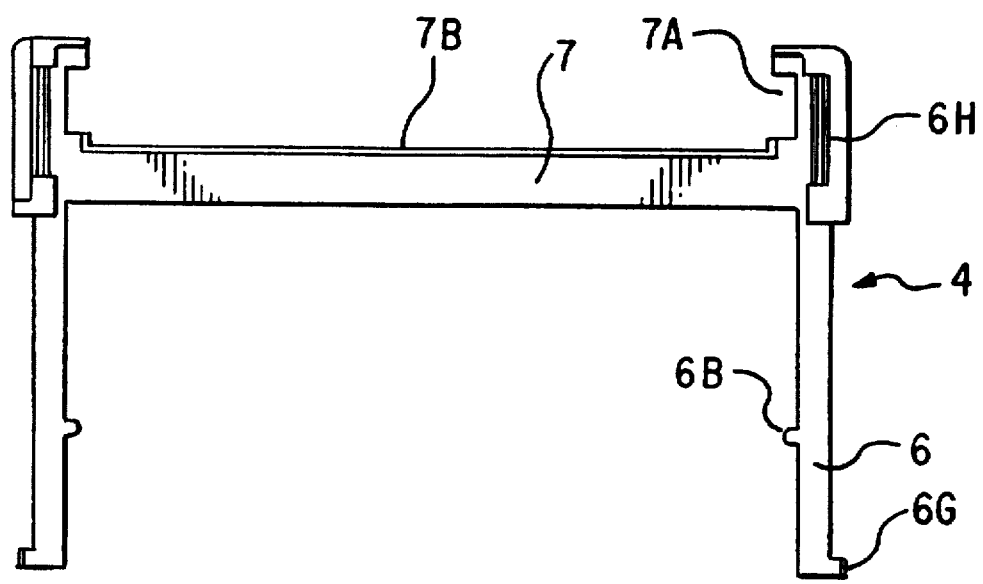
FIG. 6 is a bottom view of the front frame of FIG. 2.

As shown in FIGS. 4 and 6, a projected edge 7B is provided on the front edge of the link section 7 to form a "C" shape as viewed from top. The projected edge 7B is elongated and is raised from the bottom of the link member 7 by the thickness of a metal panel 11. The "C" shaped projected edge 7B is disposed on or near the stepped portion between the ground connection section 21 and the ground terminal 22 of the ground plate 20 attached to the socket connector 2 (see also FIG. 3).

Figure 5:
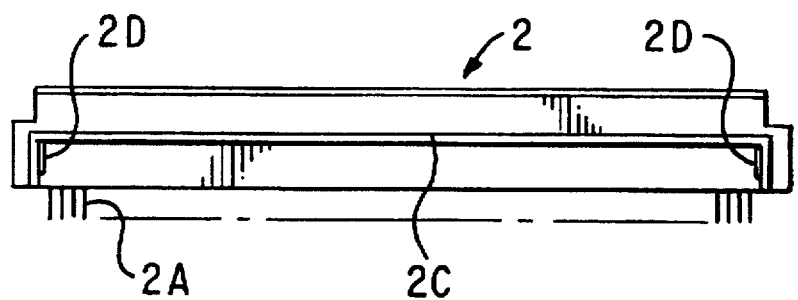
FIG. 5 is a bottom view of the socket connector of FIG. 2.

A linear projection is provided on the socket connector 2 corresponding to the projected edge 7B of the front frame 4. As shown in FIGS. 4 and 5, a C-shaped linear projection 2C is provided on the socket connector 2 so as to surround the ground connection section 21 of the ground plate 20. The linear projection 2C of the socket connector 2 and the projected edge 7B of the front frame 4 cooperate to form a closed frame which completely surrounds the ground connection section 21.

The rear frame 5 has two frame side sections 8 and a link section 9 for linking them together in the form of a "C" shape. Like the frame side sections 6 of the front frame 2, the frame side sections 8 of the rear frame 5 have guide faces 8A, support projections 8B, grooves 8C, resilient arms 8D, resilient projections 8E, lower arms 8F, and outside projections 8G. Guide grooves 9A are provided on opposite sides of a recess provided in the middle of the link section 9 for guiding the attaching extensions 3B of the rear connector 3 for securing the rear connector 3 in place. Slits 9H are provided in the side sections 8 near the link section 9.

The metal panel consists of upper and lower panels 10 and 11.

The upper panel 10 is substantially flat and has opposite sides bent downwardly. The sides consist of first side sections 12 occupying the middle portion of the sides and second side sections 13 provided at opposite ends of the sides in the longitudinal direction. The first side sections 12 each have three first engaging tabs 12A extending diagonally upwardly, and the second side sections 13 each have a second engaging tab 13A extending diagonally upwardly.

The lower panel 11 is also substantially flat but. has opposite sides and one end bent upwardly. The sides each have a first side sections 14 occupying the middle portion of the sides and second side sections 15 provided at opposite ends of the sides. The upper edge 14A of each first side section 14 is bent inwardly, and the second side sections are each provided with a square engaging opening 15A. The end has a third side section 16 bent upwardly except the middle portion, and its upper edge 16A is bent inwardly like the first side section 14. The first engaging tabs 12A of the upper panel 10 and the upper edges 14A of the lower panel 11, the second engaging tabs 13A of the upper panel 10 and the engaging openings 15A of the lower panel 11, and the link member 9 of the rear frame 5 and the upper edge 16A of the lower panel 11 form three lock mechanisms for preventing separation.

Figure 7:
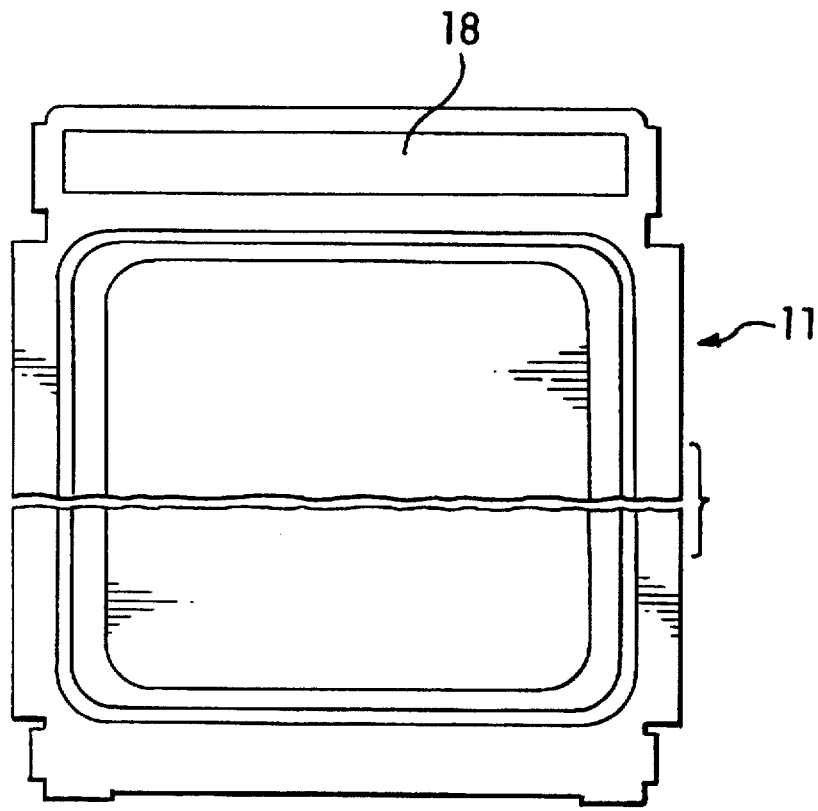
FIG. 7 is a bottom view of the lower panel.

A window 18 is provided in the lower panel 11 at the front end between the second side sections 15 for receiving the linear projections 2C of the socket connector 2 and the projected edge 7B of the front frame 4 (see FIGS. 2, 4, and 7).

A contact piece 17 extends inwardly and upwardly from one of the side sections of the lower panel 11.

The above PC card is assembled as follows.

(1) As shown in FIGS. 2 and 4, first of all, the connectors 2 and 3 are attached to the front and rear ends of the card substrate 1. Then, the ground plate 20 is attached to the socket connector 2 to provide a substrate assembly.

(2) The front and rear frames 4 and 5 are placed on the lower panel 11 such that the two pairs of second side sections 15 (FIG. 2) of the lower panel 11 are inserted into the slits 6H and 9H of the front and rear frames 4 and 6, respectively. Consequently, the projected edge 7B of the front frame 4 is aligned with the edge of the window 18 of the lower panel 11 so that there is no or little gap between the ground connection section 21 of the ground plate 20 and the lower panel 11. Under these conditions, the resilient projections 6E and 8E of the front and rear frames 4 and 5 project a little above the upper edge of the first side sections 14 of the lower panel 11.

(3) Then, the substrate assembly is placed on the lower panel 11 between the front and rear frames 4 and 5 such that the connectors 2 and 3 are attached to the upper face 7A of the link member 7 and the recess 9A (FIG. 2) of the link member 9 while the card substrate 1 is supported by the support projections 6B and 8B of the front and rear frames 4 and 5. The resilient projections 6E and 8E of the front and rear frames 4 and 5 project above the upper face of the card substrate 1 with gaps made by the outside projections 6G and 8G (FIG. 2) between the first side sections 14 of the lower panel 11 and the side sections 6 and 8 of the front and rear frames 4 and 5. The contact piece 17 of the lower panel 11 is brought into contact with a ground formed on the lower surface of the card substrate 1.

When the socket connector 2 is attached to the front frame 4, the linear projection 2C of the socket connector 2 is aligned with the edge of the window 18 and cooperates with the projected edge 7B of the front frame 4 to form a rectangular frame. Thus, the ground connection section 21 of the ground plate 20 is completely surrounded by the projected porion 2C of the socket connector 2 and the projected edge 7B of the front frame 4 (see FIG. 1, too).

(4) Finally, the upper and lower panels 10 and 11 are joined together to complete the PC card. That is, the second side sections 13 of the upper panel 10 are inserted into the slits 6H and 9H of the front and rear frames 4 and 5, respectively, so that the second engaging tabs 13A are snapped into the lower second side sections 15 in the slits 6H and 9H while the upper edges 14A and 16A of the lower panel 11 are snapped over the first engaging tabs 12A and the end 10A of the upper panel 10. When the upper and lower panels 10 and 11 are joined together, the resilient projections 6E and 8E of the front and rear frames 4 and 5 push up the upper panel 10 from the lower panel 11. Consequently, there is no or little play between the upper and lower panels 10 and 11. The upper panel 10 has escape notches 12B at positions corresponding to the outside projections 6G and 8G of the front and rear frames 4 and 5 so that the joining is made without interference.

The invention is not restricted to the embodiment illustrated in FIGS. 2 to 7. Alternatively, the linear projection on the socket connector 2 and the projected edge on the front frame 4 may be replaced by a linear projection provided on the front frame.

Figure 8:
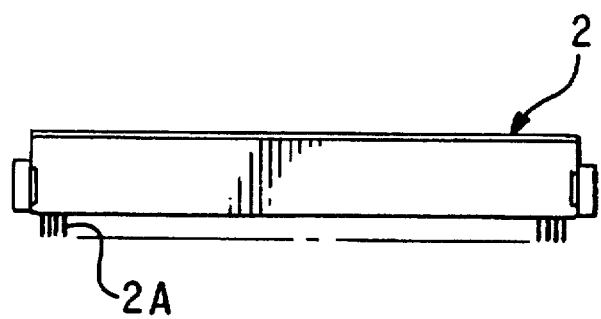
FIG. 8 is a bottom view of a socket connector according to another embodiment of the invention.
Figure 9:
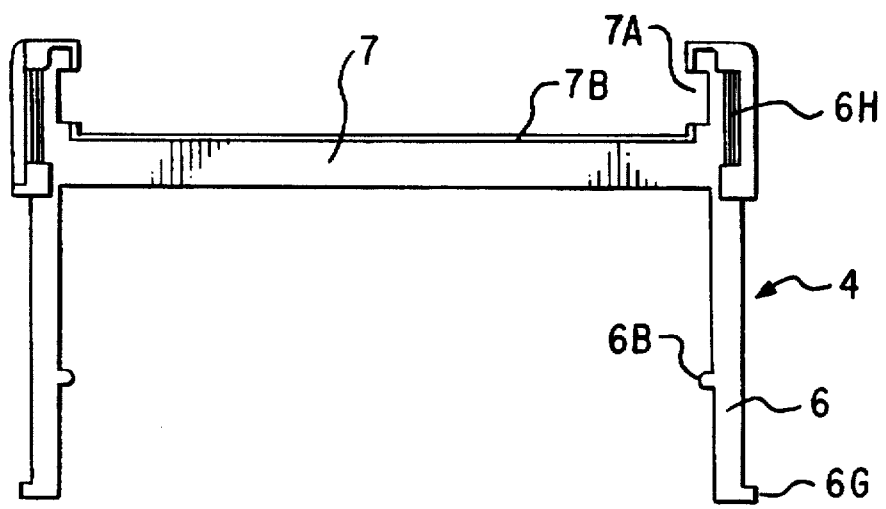
FIG. 9 is a bottom view of the front frame for the socket connector of FIG. 8.
Figure 10:
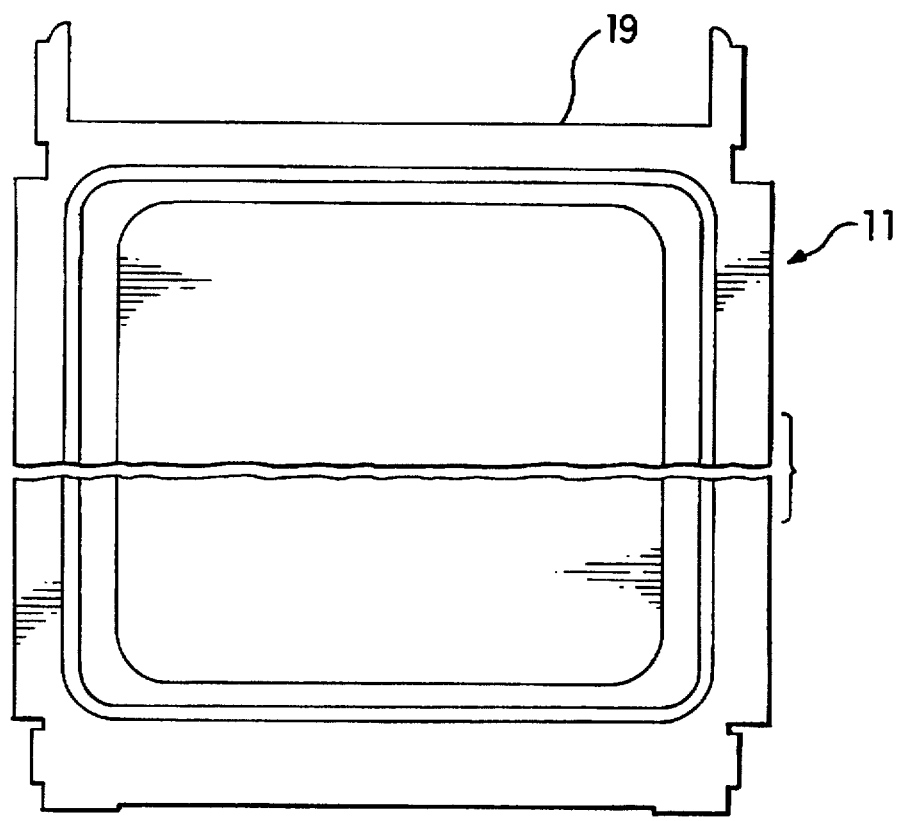
FIG. 10 is a bottom view of the lower panel for the socket connector of FIG. 8.

As shown in FIG. 8, no linear projection is provided on the socket connector 2. As shown in FIG. 9, a projected edge 7B is provided on the front frame 4. As shown in FIG. 10, a cut-out 19 is provided in the metal lower panel 11 instead of the window. With this construction, it is possible to not only close a gap between the ground connection section of the ground plate and the lower panel but also use a conventional connector which has no linear projection.

Figure 11:
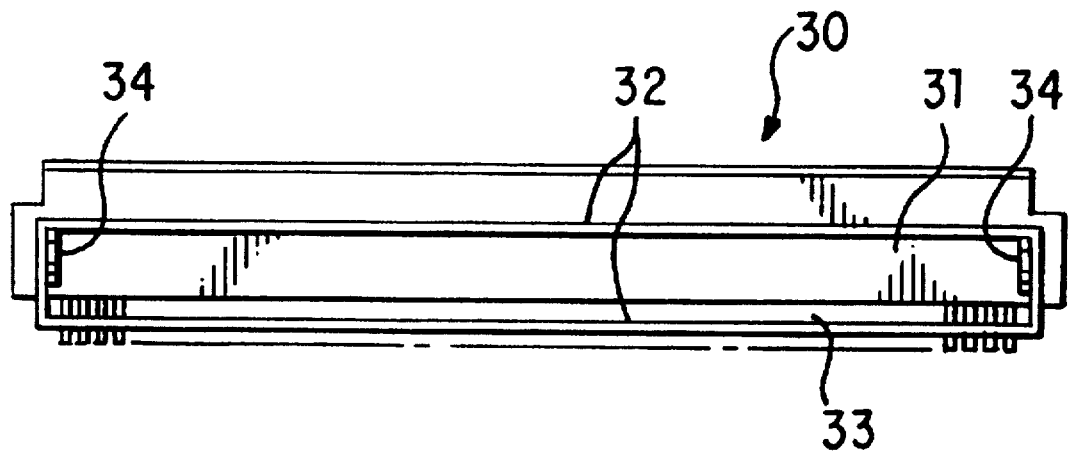
FIG. 11 is a bottom view of a connector according to still another embodiment of the invention.
Figure 12:
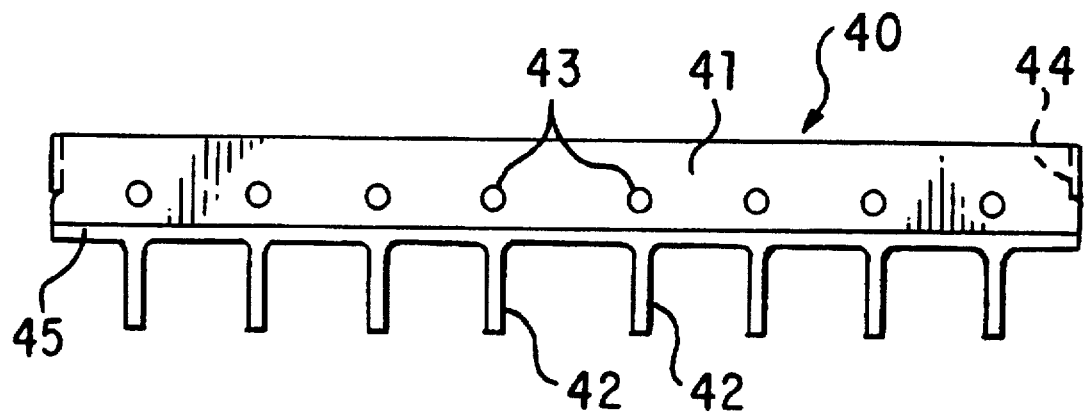
FIG. 12 is a bottom view of a ground plate for the connector of FIG. 11.

According to another aspect of the invention, a linear projection is provided on only the socket connector. A ground connection section 41 of a ground plate 40 as shown in FIG. 12 is attached to the lower face of a socket connector 30 as shown in FIG. 11. A linear projection 32 is formed on the lower face of the socket connector 30 in the form of a rectangular frame, with its half on the lower face 31 of the connector 30 and the remaining half projected from the lower face 31 to form an insertion slot 33 on the front side of the connector 30. Like the connector of FIG. 5, the connector 30 is provided with slits 34 for receiving leg members of the ground plate 40.

Similar to the ground plate of FIG. 3, the ground plate 40 has a ground connection section 41 attached to the lower surface 31 of the connector 30 and ground terminals 42 extending rearwardly from the ground connection section 41. The ground connection section 41 has dimples 43 and leg members 44 at the opposite ends to be inserted into the slits 34 of the connector 30. A curved portion 45 is provided between the ground connection section 41 and the ground terminals 42.

Figure 13:
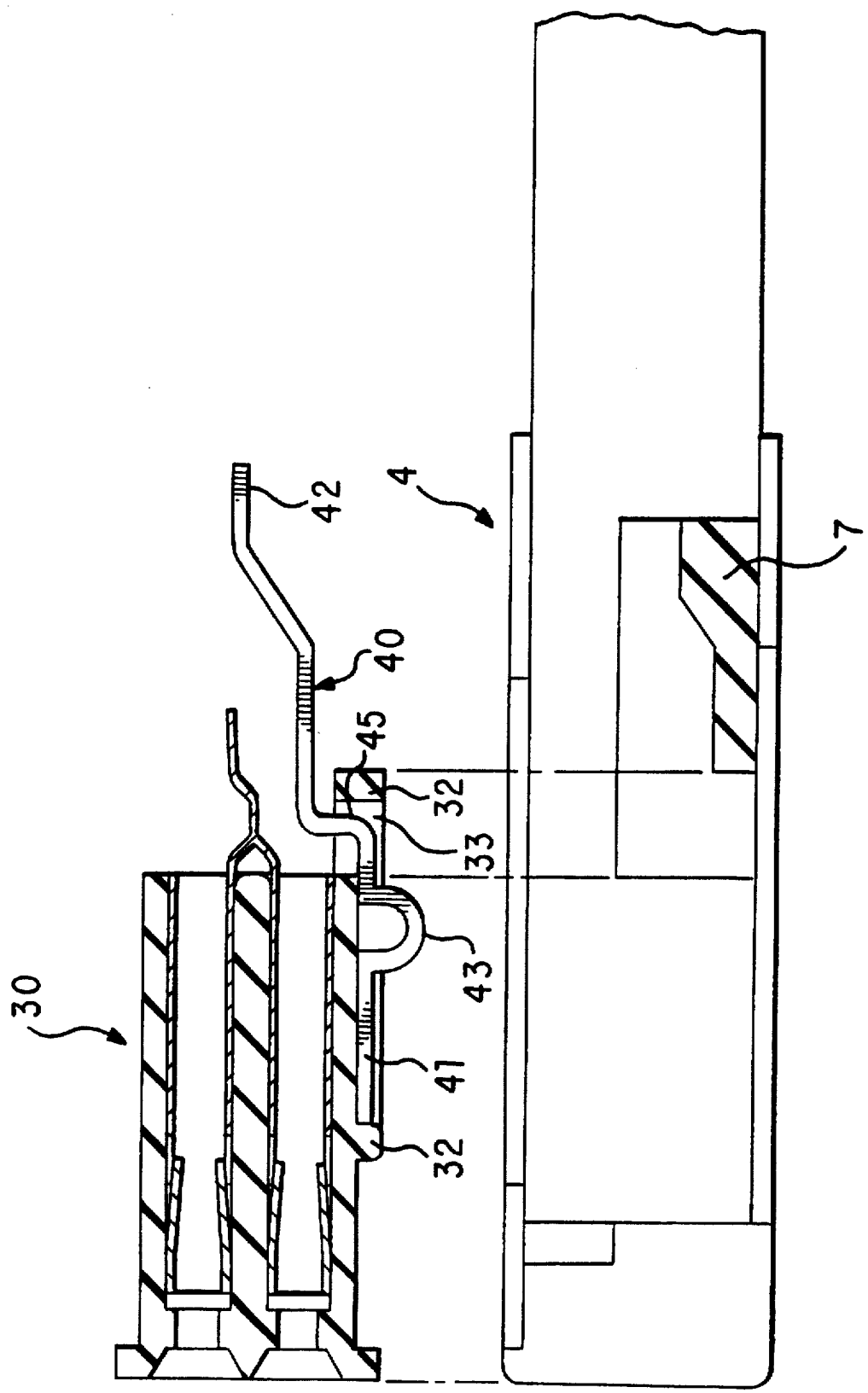
FIG. 13 is a sectional view of an assembly of the connector of FIG. 11 and the ground plate of FIG. 12.
Figure 14:
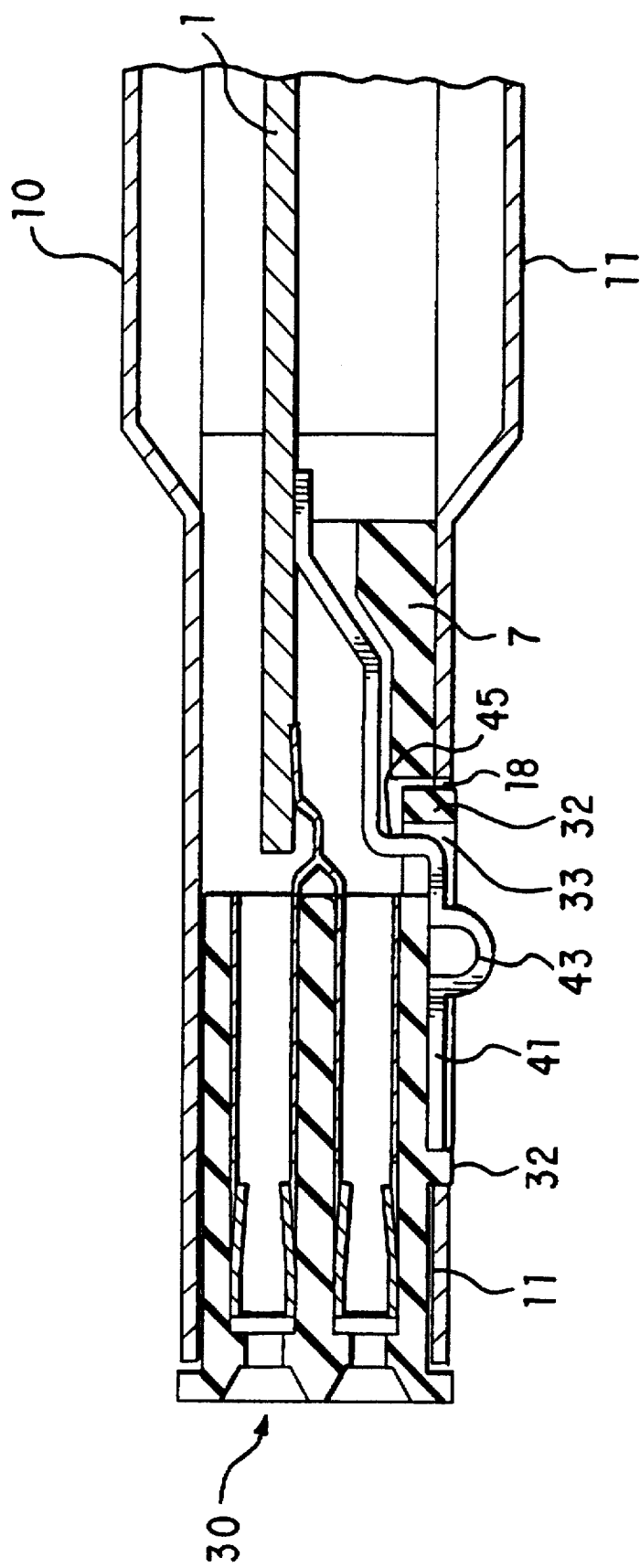
FIG. 14 is a sectional view of a PC card made from the components of FIG. 13.
Figure 15:
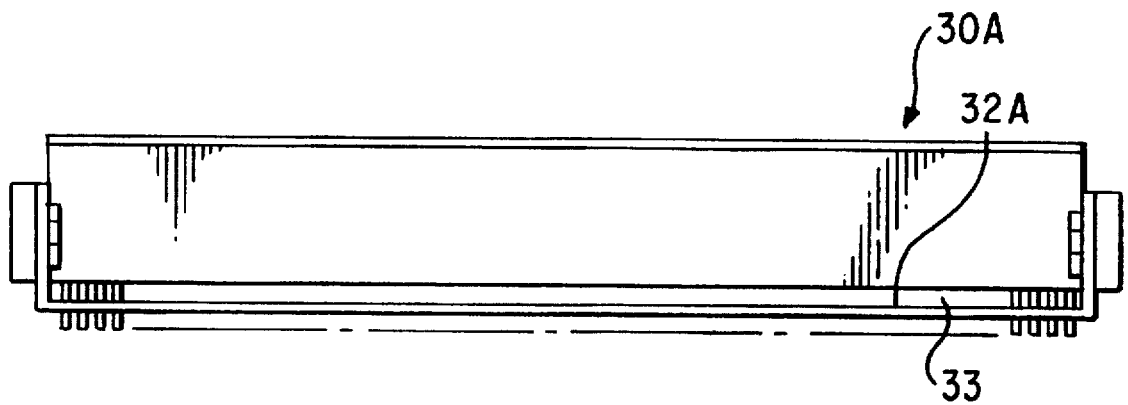
FIG. 15 is a bottom view of a connector according to yet another embodiment of the invention.
Figure 16:
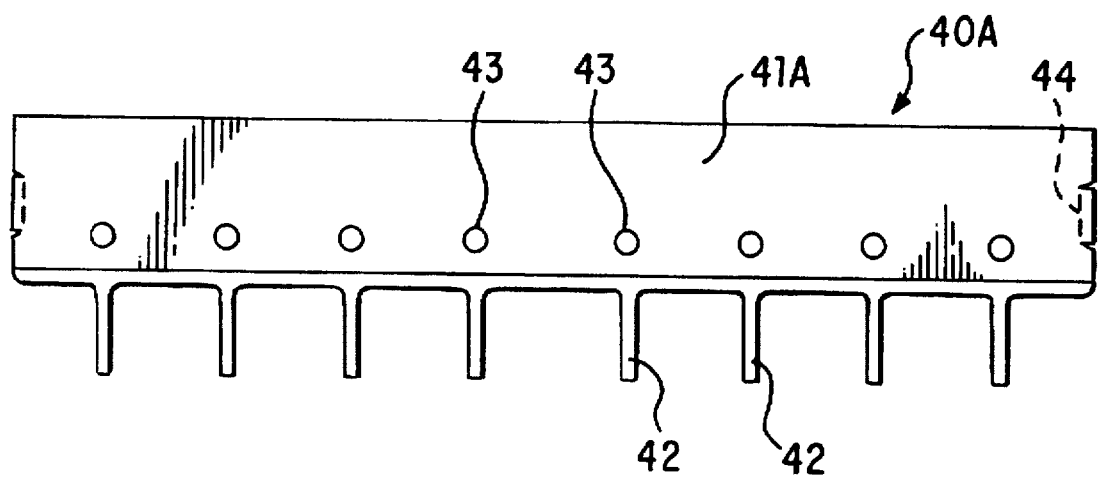
FIG. 16 is a bottom view of a ground plate for the connector of FIG. 15.
Figure 17:
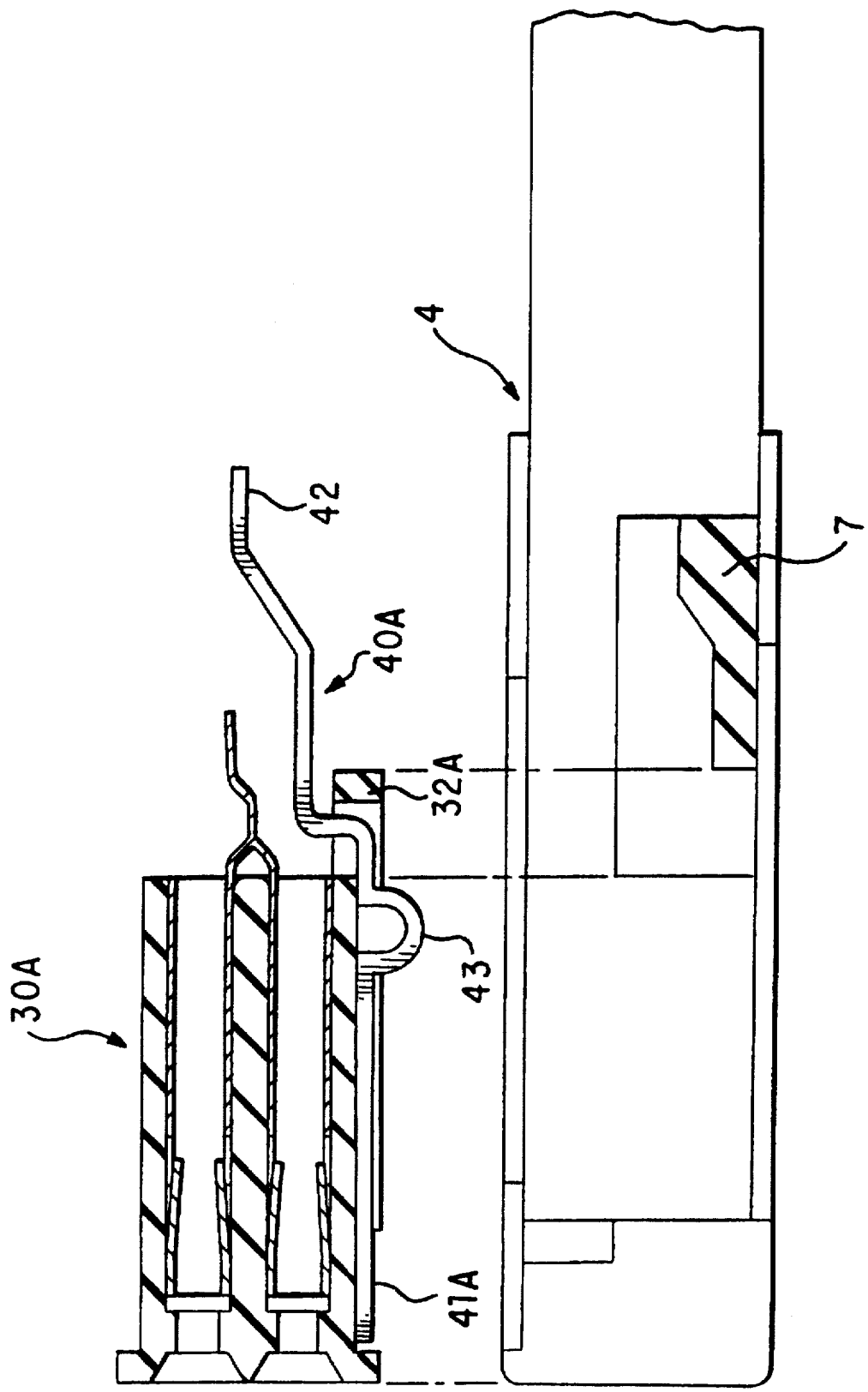
FIG. 17 is a sectional view of an assembly made from the connector of FIG. 15 and the ground plate of FIG. 16.
Figure 18:
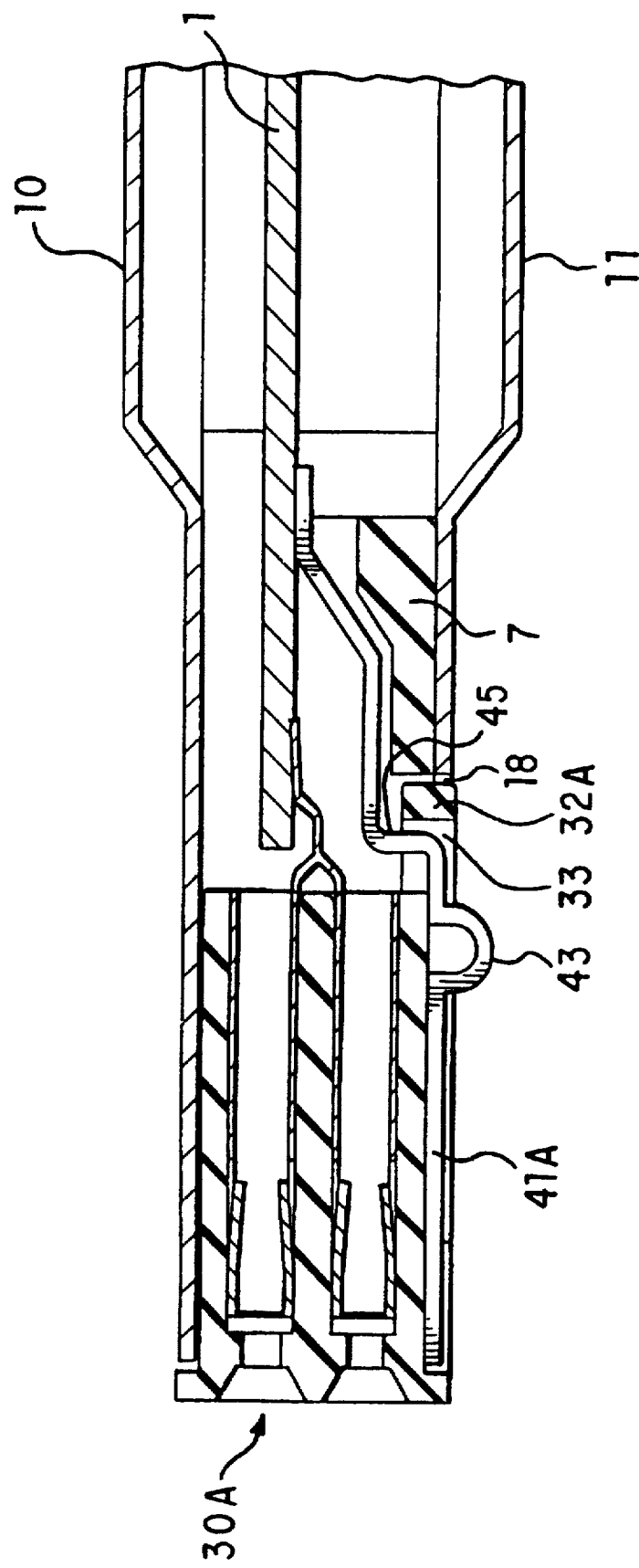
FIG. 18 is a sectional view of a PC card made from the components of FIG. 17.
Figure 19:
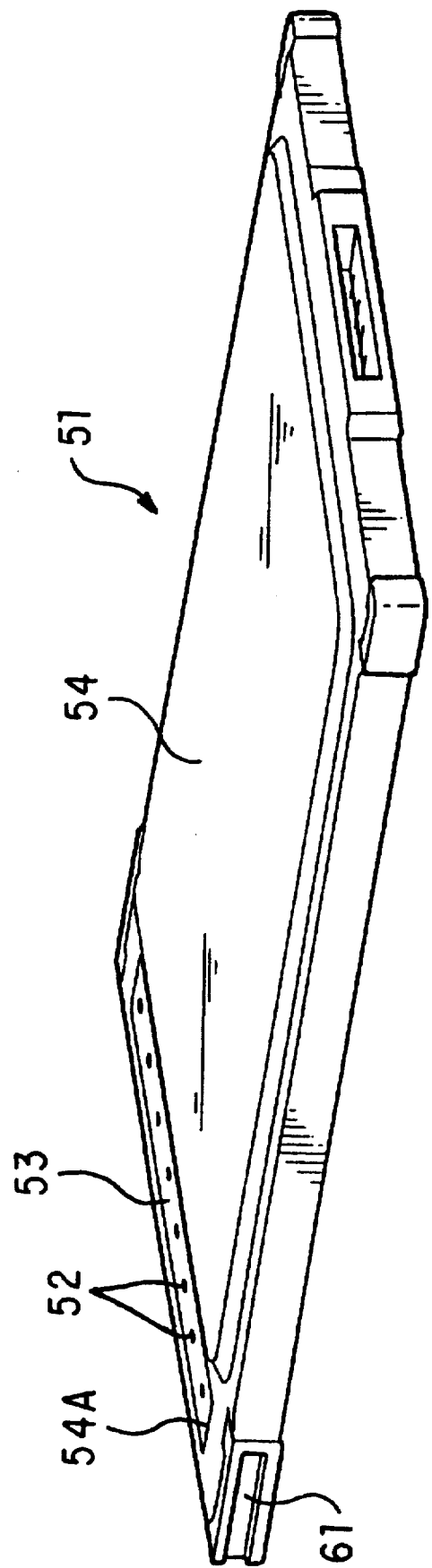
FIG. 19 is a perspective view of a conventional PC card.
Figure 20:
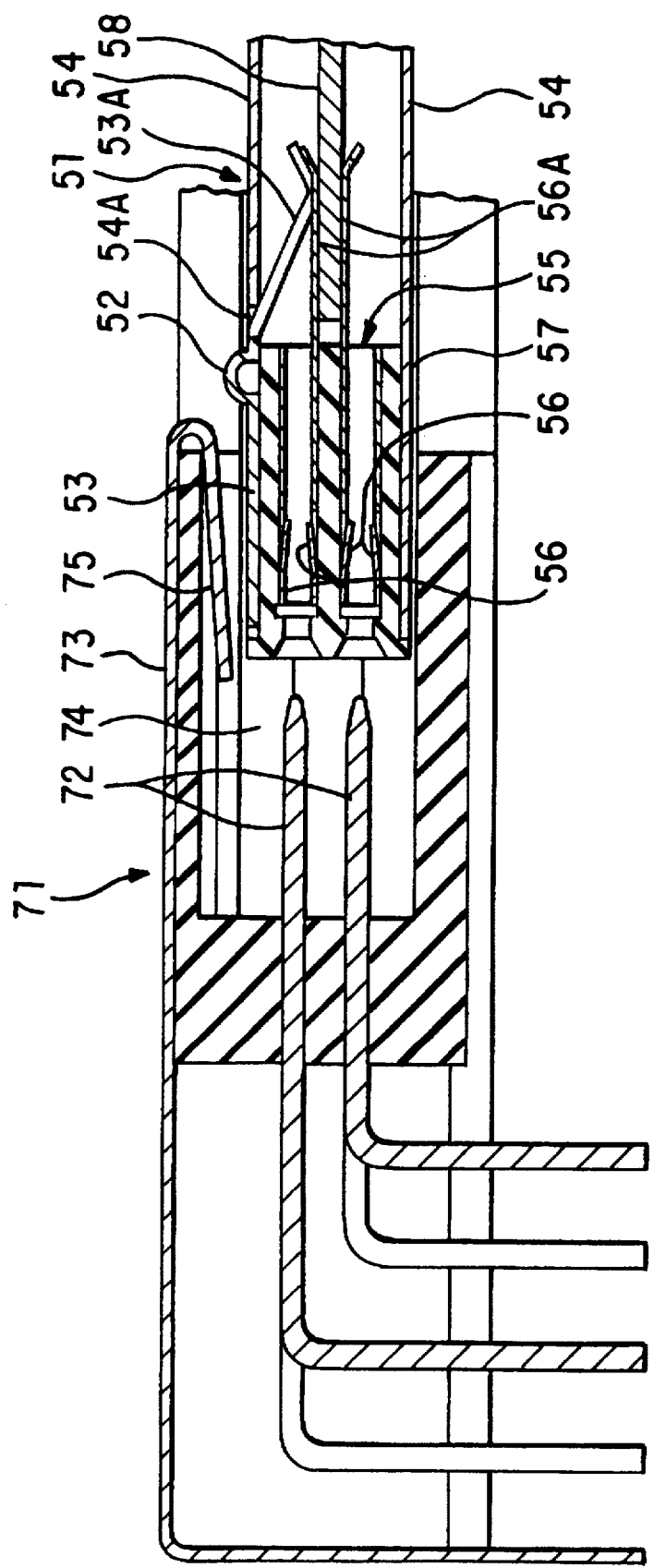
FIG. 20 is a sectional view of the PC card of FIG. 19.

As shown in FIG. 13, the ground plate 40 is attached to the connector 30 such that the ground connection section 41 is brought into contact with the lower face 31 of the connector 30 while the leg members 44 are inserted into the slits 34. Thus, the ground connection section 41 is surrounded by the closed linear projection 32, and there is little gap between the linear projection 32 and the insertion slot 33. As shown in FIG. 14, it is assembled into the front frame 4 together with the lower panel 11 with a window 18 as shown in FIG. 7 to form a PC card. In this embodiment, a conventional frame kit is used as it is. It is only necessary to provide a linear projection on the socket connector.

Where the lower panel 11 has a cut-out 19 instead of the window as shown in FIG. 10, a C-shaped linear projection 32A having three sides corresponding to edges of the cut-out 19 is provided on the connector 30A as shown in FIG. 15. That is, the linear projection 32A is different from that of FIG. 11 in that it is open at the back of the connector 30A (the upper portion in FIG. 15). The insertion slot 33 formed on the front portion of the connector 30A is similar to that of FIG. 11. The ground plate 40A is identical with that of FIG. 12 except that the ground connection section 41A has a wider upper portion as shown in FIG. 16. The ground plate 40A is attached to the connector 30A as shown in FIG. 17, and assembled to provide a PC card as shown in FIG. 18.

As has been described above, a linear projection is provided on at least one of the frame holder and the socket connector to surround the ground connection section of a ground plate attached to the socket connector and close a gap between the ground connection section and the metal panel so that no dust or water enters through the gap. In addition, the linear projection prevents contact between the ground connection section and the metal panel, thus minimizing transmission of noise to the ground panel.

What is claimed is:

1. A PC card comprising:

a card substrate having a signal circuit and a ground circuit thereon;

a socket connector having a socket block attached to said card substrate;

a frame holder for holding said card substrate and said socket connector in place;

a pair of metal panels for covering upper and lower faces of said card substrate;

at least one contact element extending through said socket block and having a connection section for connection to a mating connector with a shield plate and a contact section for contact with said signal circuit;

a ground metal plate having a substantially flat ground connection section attached to an outside surface of said socket block for connection to said shield plate of said mating connector, a flexible ground terminal for contact with said ground circuit of said card substrate, and a curved portion between said ground connection section and said ground terminal;

one of said metal panels having an accommodation opening defined by at least rear, and side edges;

a liner projection provided on an outside surface of at least one of said frame holder and said socket in alignment with said rear edge of said accommodation opening for closing a gap between said curved portion and said metal panel.

2. A PC card according to claim 1, wherein said accommodation opening is a window defined by front, rear, and sides edges, and said linear projection is provided on each of said frame holder and said socket block, forming an annular projection in alignment with said edges of said window.

3. A PC card according to claim 1, wherein said accommodation opening is a cut-out with rear and side edges corresponding to said socket body, and said frame holder is provided with projected edges in alignment with said edges of said cut-out.

4. A PC card according to claim 1, wherein said accommodation opening is a window, said socket block is provided with a linear projection extending along an edge of said window to form an insertion slot along a side of said linear projection for receiving said curved portion of said ground plate.

5. A PC card according to claim 1, wherein said accommodation opening is a cut-out with rear and side edges corresponding to said socket block, and said socket block is provided with a linear projection along said edges of said cut-out to form an insertion slots along a side of said linear projection for receiving said curved portion of said ground plate.

6. A PC card frame kit for a substrate assembly including a card substrate, a connector with a ground plate attached to the circuit board, said ground plate having a connection section for connection to a shield plate of a mating connector and a ground terminal for contact with a ground circuit on said card substrate, and a curved section between the connection section and the ground terminal, comprising:

a frame holder made of an insulation material so as to hold said substrate assembly;

a pair of metal panels to be joined together so as to cover upper and lower faces of said substrate assembly;

an accommodation opening provided in one of said metal panels and having an edge along said curved portion; and a linear projection provided on said frame holder along said edge of said accommodation opening to close a gap between said curved portion of said ground plate and said metal panel.

* * * * *